United States Patent
Rodnick et al.

(10) Patent No.: US 9,214,375 B2
(45) Date of Patent: Dec. 15, 2015

(54) END EFFECTOR HAVING MULTIPLE-POSITION CONTACT POINTS

(75) Inventors: Matthew J. Rodnick, San Jose, CA (US); Brandon L. Senn, Fremont, CA (US); Andrew J. Nagengast, Sunnyvale, CA (US); Richard M. Blank, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 674 days.

(21) Appl. No.: 13/545,190

(22) Filed: Jul. 10, 2012

(65) Prior Publication Data

US 2014/0017042 A1 Jan. 16, 2014

(51) Int. Cl.
*H01L 21/687* (2006.01)
*B25J 9/16* (2006.01)
(52) U.S. Cl.
CPC ......... *H01L 21/68707* (2013.01); *B25J 9/1612* (2013.01)
(58) Field of Classification Search
CPC ................... H01L 21/68707; H01L 21/67028; B25J 9/1612

USPC ................................ 414/941, 222.07; 901/30
See application file for complete search history.

(56) References Cited

U.S. PATENT DOCUMENTS

| 6,109,677 A * | 8/2000 | Anthony ....................... 414/941 |
| 7,563,042 B2 * | 7/2009 | Nakaharada et al. .......... 414/941 |
| 7,644,968 B2 * | 1/2010 | Hirooka et al. ............... 414/941 |
| 2012/0101633 A1 | 4/2012 | Rodnick |

* cited by examiner

*Primary Examiner* — Gerald McClain
(74) *Attorney, Agent, or Firm* — Beyer Law Group LLP (57) ABSTRACT

An apparatus is provided for lifting a substrate. The apparatus comprises a first piece and a second piece. The apparatus further comprises a set of first contact points in a plane and a set of second contact points, where at least one contact point from each set is present on the first piece and the second piece. The apparatus also comprises an actuator that translates the first piece, substantially parallel to the plane, between a first position and a second position relative to the second piece. Additionally, the first position arranges the set of first contact points so that all of the contact points of the set of first contact points are able to engage the substrate, and the second position arranges the set of second contact points so that all of the contact points of the second set of contact points are able to engage the substrate.

11 Claims, 12 Drawing Sheets

END EFFECTOR HAVING MULTIPLE-POSITION CONTACT POINTS

FIELD OF THE INVENTION

The present invention relates to the production of semiconductor devices. More specifically, the invention relates to the transportation of substrates utilized in the production of semiconductor devices.

BACKGROUND OF THE INVENTION

The present invention relates to transporting microelectronic devices during two steps of processing. More specifically, the present invention relates to utilizing two segregated sets of contact points on a single apparatus for the transport of microelectronic devices.

During semiconductor wafer processing, efforts are made to avoid contaminating microelectronic devices. For example, if the microelectronic devices are processed through different steps, the handling of the wafers may deposit residue on contact points. Accordingly, the contact points for handling microelectronic devices are separated through the use of different apparatuses associated with stages of the microelectronic device processing.

SUMMARY OF THE INVENTION

To achieve the foregoing and in accordance with the purpose of the present invention, an apparatus for lifting a substrate is provided. The apparatus comprises a first piece and a second piece. Additionally, the apparatus comprises a set of first contact points in a plane. At least one first contact point is on the first piece and at least one first contact point is on the second piece. The apparatus also comprises a set of second contact points. At least one second contact point is on the first piece and at least one second contact point is on the second piece. Further, the apparatus comprises an actuator that translates the first piece, substantially parallel to the plane, between a first position and a second position relative to the second piece. In particular, the first position arranges the set of the first contact points so that all of the contact points of the set of first contact points are able to engage the substrate. Additionally, the first position arranges the set of the second contact points so that none of the contact points of the set of second contact points are able to engage the substrate. Additionally, the second position arranges the set of the second contact points so that all of the contact points of the set of second contact points are able to engage the substrate. The second position also arranges the set of first contact points so that none of the contact points of the set of first contact points are able to engage the substrate.

In another embodiment of the present invention, a method of using an apparatus to transport a substrate is provided. The method comprises translating a first piece of the apparatus along a plane with respect to a second piece of the apparatus to a first position. In particular, the plane is defined as including each of the set of first contact points. Further, the first position arranges a set of first contact points so that all of the contact points of the set of first contact points are able to engage the substrate. The first position also arranges a set of second contact points so that none of the contact points of the set of second contact points are able to engage the substrate. The method further comprises placing the substrate to engage the set of first contact points. Additionally, the method comprises transporting the substrate to a first destination. In particular, the substrate is transported substantially parallel to a plane defined by the set of first contact points. The method also comprises discharging the substrate from the set of first contact points. Further, the method comprises translating the first piece of the apparatus to a second position. In particular, the first piece of the apparatus is translated substantially parallel to the plane. The second position arranges the set of second contact points so that all of the contact points of the set of second contact points are able to engage the substrate. The second position also arranges the set of first contact points so that none of the contact points of the set of first contact points is able to engage the substrate. The method also comprises placing a modified substrate to engage the set of second contact points. Additionally, the method comprises transporting the modified substrate to a second destination. In particular, the substrate is transported substantially parallel to a plane defined by the set of first contact points. The method also comprises discharging the modified substrate from the set of second contact points.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Many processes used in the fabrication of semiconductor microelectronic devices require the surfaces of the microelectronic devices to be clean. In order to clean the microelectronic devices, different apparatuses, such as end effectors, are generally used 1) to place a microelectronic device into the cleaning chamber and 2) to remove the microelectronic device from the chamber. Currently, these two steps are performed using different tools. For example, an end effector may be used. An end effector is a device or tool that's connected to the end of a robot arm. The end effector is the part of the robot that interacts with the environment. In semiconductor manufacturing, some end effectors are employed to transport semiconductor wafers between different locations, such as transporting wafers from a storage cassette to a cleaning chamber.

In particular, a first end effector may be used to transport a pre-cleaning microelectronic device from a first cassette to a cleaning chamber, while a second end effector may be used to transport the post-cleaning microelectronic device from the cleaning chamber to a second cassette. In embodiments, the first cassette may be the same as the second cassette. This is done because the contact points of the first end effector are considered to be dirtied by their interaction with the pre-cleaning microelectronic device. As such, the second end effector, with non-dirtied contact points, is required to remove the post-cleaning microelectronic device so as not to contaminate the post-cleaning microelectronic device.

Embodiments of the present invention, however, provide an apparatus that comprises two sets of contact points. In particular, embodiments of the present invention discuss an apparatus that may be used to transport a pre-cleaned microelectronic device from a first cassette to the cleaning chamber utilizing a set of first contact points. Additionally, the apparatus may be used to transport a post-cleaned microelectronic device from the cleaning chamber to a second cassette utilizing a set of second contact points that are segregated from the set of first contact points. Since the set of first contact points and the set of second contact points do not come into contact with each other, the respective contact points remain segregated to their particular purposes. For example, the set of first contact points is used to engage a pre-cleaning microelectronic device and the set of second contact points is used to engage a post-cleaning microelectronic device. In particular, contact points are engaged when the contact points are in contact with a substrate.

Microelectronic devices may include substrates, such as wafers. A wafer may engage with an apparatus through one or more contact points. A contact point is a portion of a pad that engages with a substrate, such as a wafer. A contact point engages with a substrate when the contact point is touching a portion of the wafer. In particular, a wafer may engage with an apparatus via contact points so as to minimize movement of the substrate on pads. In embodiments, a pad may have more than one contact point. Additionally, some embodiments may include covers for moving parts of the apparatus, such as an actuator mechanism.

Further, the wafers may be stored in a cassette. The cassette may also be known as a "FOUP" (front opening unified pod). Accordingly, the design of an apparatus, such as an end effector, may be limited based on constraints of the cassette being used to hold the wafers. For example, wafer slots of a cassette may have a 10 mm height constraint through which the end effector must pass. Given this narrow height constraint, it would be very difficult to segregate contact points based on a solely vertical displacement. Accordingly, each different configuration of an apparatus in accordance with embodiments of the present invention has a characteristic position of a first piece of the apparatus relative to a second piece of the apparatus that is in compliance with a cassette's sizing. The present invention includes apparatuses having varied configurations of contact points based on a position of the first piece relative to the second piece.

Further, the length of the end effector may be limited based on the depth of the cassette/FOUP. In particular, the back of a FOUP may have an area known as a "FOUP end effector exclusion zone" that limits the area where the end effector may extend. Accordingly, in some embodiments of the present invention, the configuration of the apparatus is constrained by the horizontal depth of a cassette. This is due to the back panel of the cassette. In cassettes with an open or partially open back panel, however, the horizontal depth of embodiments of the present invention would not necessarily be so constrained. In these instances, the translation of a first piece of the apparatus relative to a second piece of the apparatus may be constrained by the placement of a cassette against a wall or other impeding structure.

Figure 1:
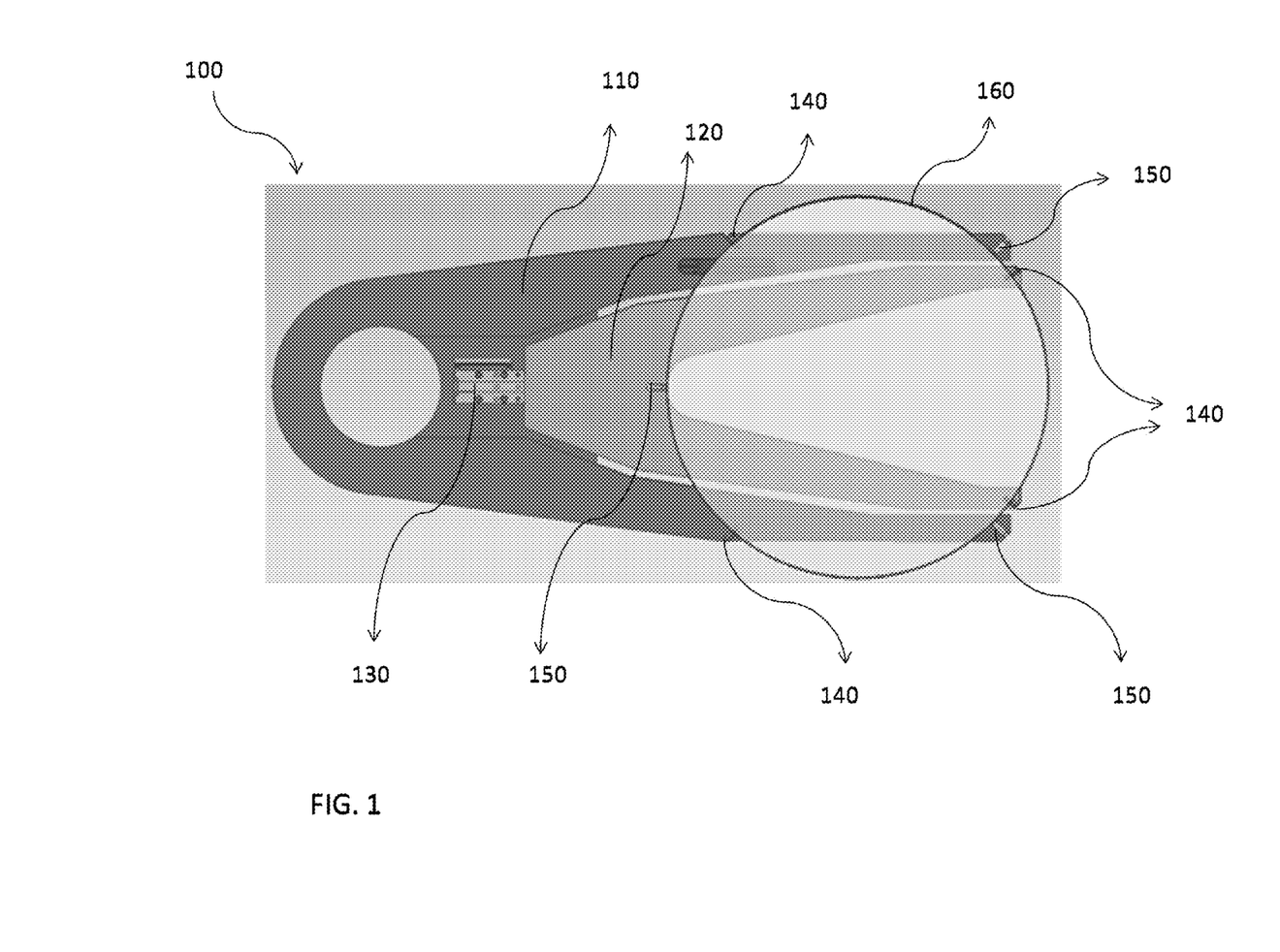
FIG. 1 illustrates a first configuration of an apparatus, in accordance with an embodiment of the present invention.

FIG. 1 illustrates a first configuration 100 of an apparatus, in accordance with an embodiment of the present invention. In particular, FIG. 1 comprises an outer piece 110, an inner piece 120, an actuator 130, a set of first contact points 140, a set of second contact points 150, and a wafer 160. Outer piece 110 has a fork-like structure with two arms extending from a base. Inner piece 120 also has a fork-like structure, with two arms extending through the inner space between the two arms of outer piece 110. Further, in FIG. 1 the length of the arms of inner piece 120 extends beyond the length of the arms of outer piece 110. However, in alternative embodiments, the length of the arms of outer piece 110 may extend beyond the length of arms of inner piece 120. Further, the placement of contact points may be modified along the arms of outer piece 110 and inner piece 120. In particular, the placement of contact points may depend on whether a substrate, such as a wafer, may engage with a set of first contact points in a first configuration of the apparatus to the exclusion of a set of second contact points; and further, whether the substrate may engage with a set of second contact points in a second configuration of the apparatus to the exclusion of a set of first contact points.

In a specific example, a first configuration of the apparatus may include that all of the contact points of the set of first contact points are circumscribed within a circle having a diameter that is equal to the substrate diameter. A set of points is circumscribed within a circle when the points are on or within the circle. In FIG. 1, the circle having a diameter that is equal to the substrate diameter is below the substrate, wafer 160. In particular, wafer 160 is a circle having a diameter. Accordingly, the substrate diameter in FIG. 1 is the diameter of wafer 160. Further, the circle having a diameter that is equal to the substrate diameter is aligned with and beneath wafer 160. Further, the first configuration also includes that all of the contact points of the set of second contact points are outside a circle having a diameter that is equal to the substrate diameter.

Additionally, actuator 130 may be used to change the placement of inner piece 120 with respect to outer piece 110. In particular, actuator 130 may comprise an apparatus mechanism that allows inner piece 120 to travel along a geometric plane that includes outer piece 110. In a specific example, inner piece 120 may be translated between a first and second position. In particular, inner piece 120 may be translated along a plane that is substantially parallel to outer piece 110. This plane may be defined by the set of first contact points. Further, this plane may be defined by the set of second contact points.

As seen in FIG. 1, wafer 160 engages each contact point of the set of first contact points 140. Further, each contact point of the set of second contact points 150 is clear of wafer 160. As such, the set of first contact points 140 is completely segregated from the set of second contact points 150. Additionally, wafer 160 completely fails to engage the any contact point of the set of second contact points 150.

Figure 2:
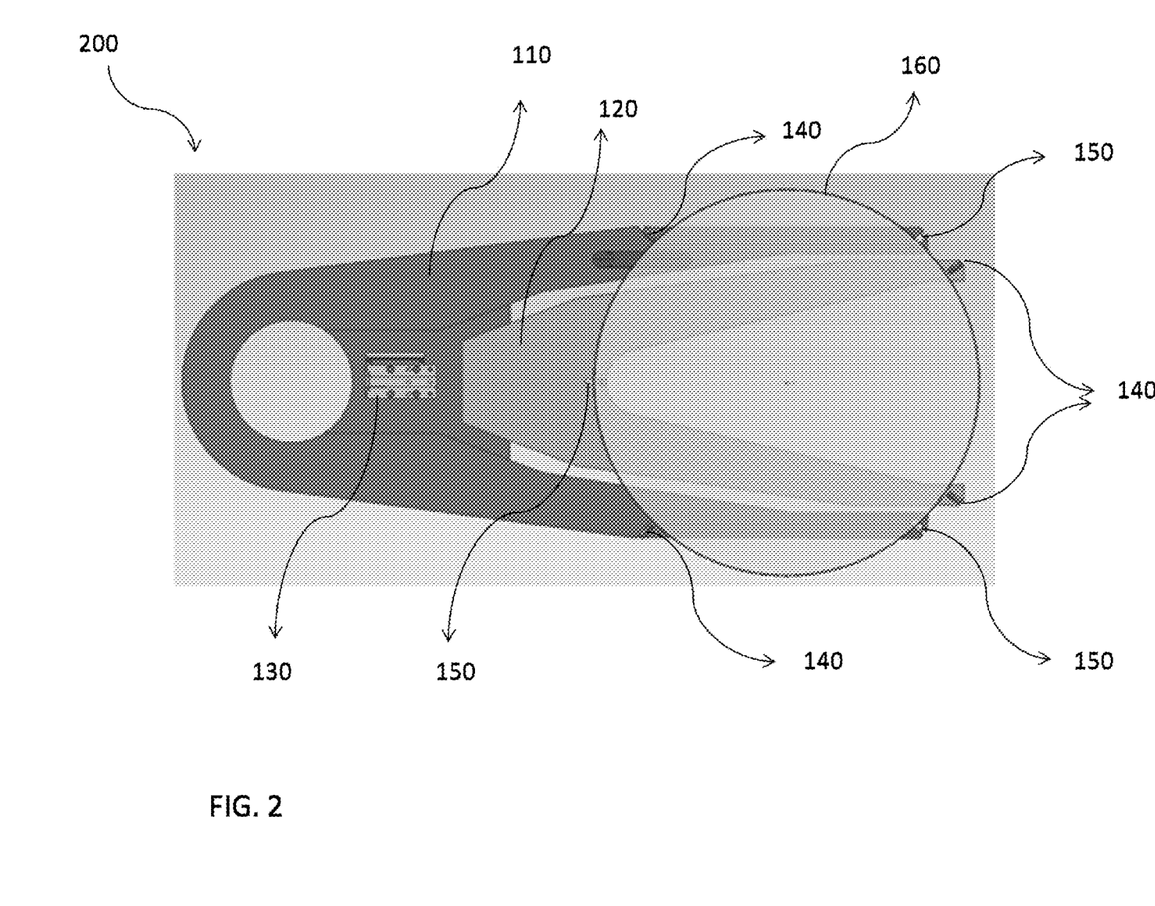
FIG. 2 illustrates a second configuration of an apparatus, in accordance with the embodiment of the present invention provided in FIG. 1.

Accordingly, FIG. 2 illustrates a second configuration 200 of an apparatus, in accordance with the embodiment of the present invention provided in FIG. 1. Similar to FIG. 1, FIG. 2 comprises an outer piece 110, an inner piece 120, an actuator 130, a set of first contact points 140, a set of second contact points 150, a wafer 160, and directions 170. However, inner piece 120 is in a first position in first configuration 100, and is in a second position in second configuration 200. In particular, in first configuration 100, inner piece 120 of the apparatus is in a first position relative to outer piece 110. In contrast, in second configuration 200, inner piece 120 of the apparatus is in a second position relative to outer piece 110, where the second position has a gap of 20 mm between the placement of inner piece 120 in the first position in first configuration 100 and inner piece 120 in the second position in second configuration 200. In both first and second positions, however, the set of first contact points 140 are in the same plane as the set of second contact points 150, respectively. In particular, the inner piece 120 is translated along the plane relative to outer piece 110 between the first and second positions. In a specific example, inner piece 120 may be translated in either direction of directions 170. Further, wafer 160 engages each contact point of the set of second contact points 150.

In another specific example, a second configuration of the apparatus may include that all of the contact points of the set of second contact points are circumscribed within a circle having a diameter that is equal to the substrate diameter. A set of points is circumscribed within a circle when the points are one or within the circle. In FIG. 2, the circle having a diameter that is equal to the substrate diameter is below the substrate, wafer 160. In particular, wafer 160 is a circle having a diameter. Accordingly, the substrate diameter in FIG. 1 is the diameter of wafer 160. Further, the circle having a diameter that is equal to the substrate diameter is aligned with and beneath wafer 160. Further, the second configuration also includes that all of the contact points of the set of first contact points are outside a circle having a diameter that is equal to the substrate diameter.

Further, each contact point of the set of first contact points 140 is clear of the wafer 160 in the second configuration. As such, the set of second contact points 150 are completely segregated from the set of first contact points 140. Additionally, wafer 160 completely fails to engage the any contact point of the set of first contact points 140 in the second configuration.

In alternative embodiments, a set of first contact points and a set of second contact points may be placed on an apparatus in accordance with embodiments of the present invention such that a set of first contact points engages with a substrate to the mutual exclusion of a set of second contact points when an inner piece of the apparatus is in a first position relative to an outer piece of the apparatus. Further, in this same alternative embodiment, the set of second contact points engages with the substrate to the mutual exclusion of the set of first contact points when the inner piece of the apparatus is in the second position relative to the outer piece of the apparatus. However, while illustrated embodiments show each contact point engaged with an edge portion of a substrate, it is also within the disclosure of the present invention that one or more contact points may engage with other portions of the substrate so long as each contact point of a set of first contact points is in contact with the substrate to the mutual exclusion of each contact point of the set of second contact points.

For example, when an inner piece of an apparatus is in a first position relative to an outer piece of the apparatus, one or more contact points of the set of first contact points may engage a substrate, and may engage the substrate at any portion of the substrate. However, each contact point of the set of first contract points must not engage the substrate when the apparatus is in a second position, where each contact point of the set of second contact points engages the substrate. Similarly, when the inner piece of the apparatus is in the first position relative to the outer piece of the apparatus, each contact point of the set of second contact points must not engage the substrate.

Figure 3:
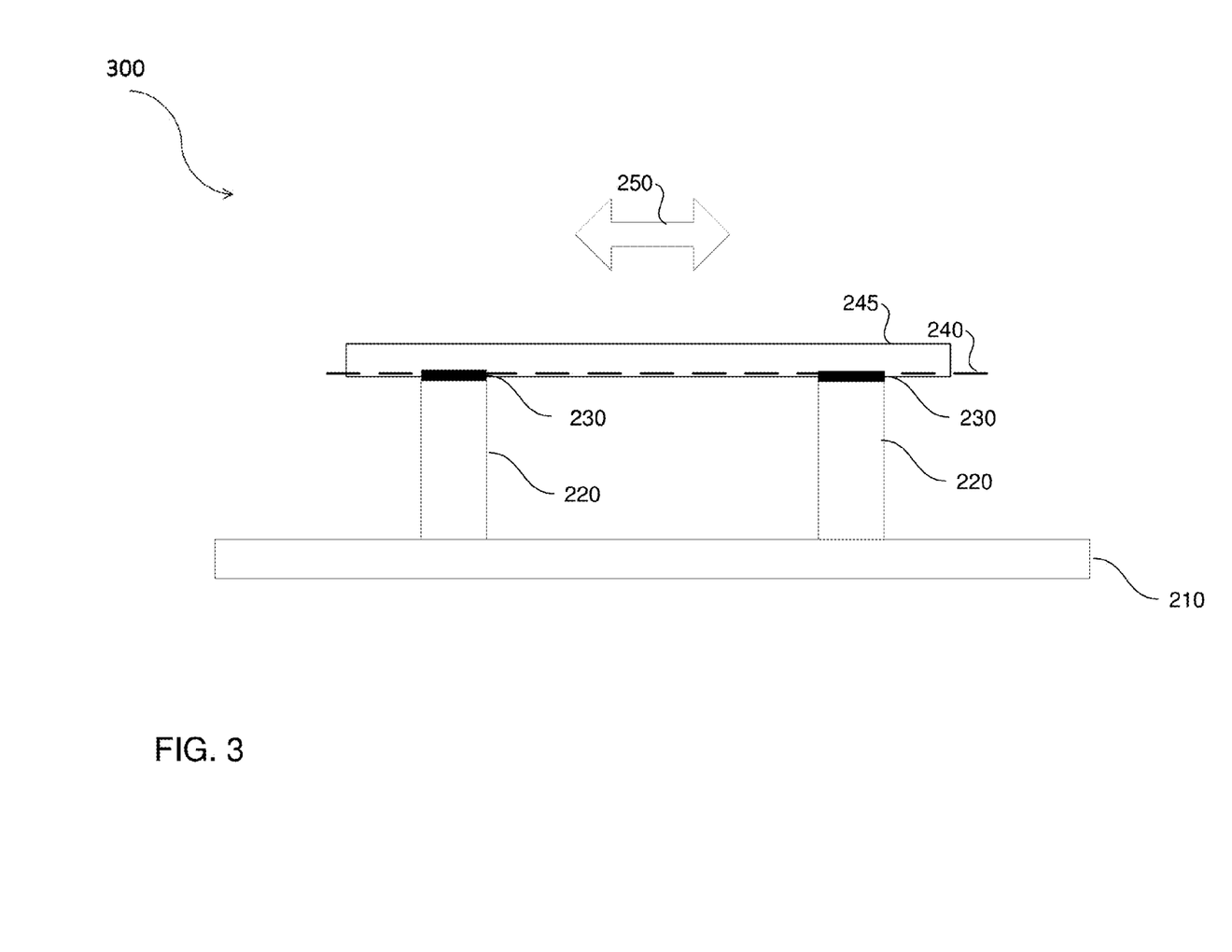
FIG. 3 illustrates a system of a substrate engaging with contact points that are in a plane, in accordance with an embodiment of the present invention.

FIG. 3 illustrates a system 300 of a substrate 245 engaging with contact points 230 that are in a plane 240, in accordance with an embodiment of the present invention. FIG. 3 comprises base platform 210, pads 220, contact points 230, plane 240, substrate 245, and directions 250. In particular, a portion of pads 220 engages with substrate 245. The portions of pads 220 that engage with the substrate 245 are contact points. Accordingly, the portions of pads 220 that engage with substrate 245 are contact points 230. Further, contact points 230 are in a plane, such as plane 240. As illustrated in FIG. 3, plane 240 is represented as a line since the plane is perpendicular to the sheet of paper. Accordingly, the plane is cutting through the paper as seen by a viewer of FIG. 3. In particular, plane 240 is defined to include contact points 230. Additionally, when an inner piece of an apparatus, such as inner piece 120, is translated along plane 240, inner piece 120 may be translated in either direction of directions 250. Further, directions 250 are substantially parallel to plane 240 as shown.

Figure 4:
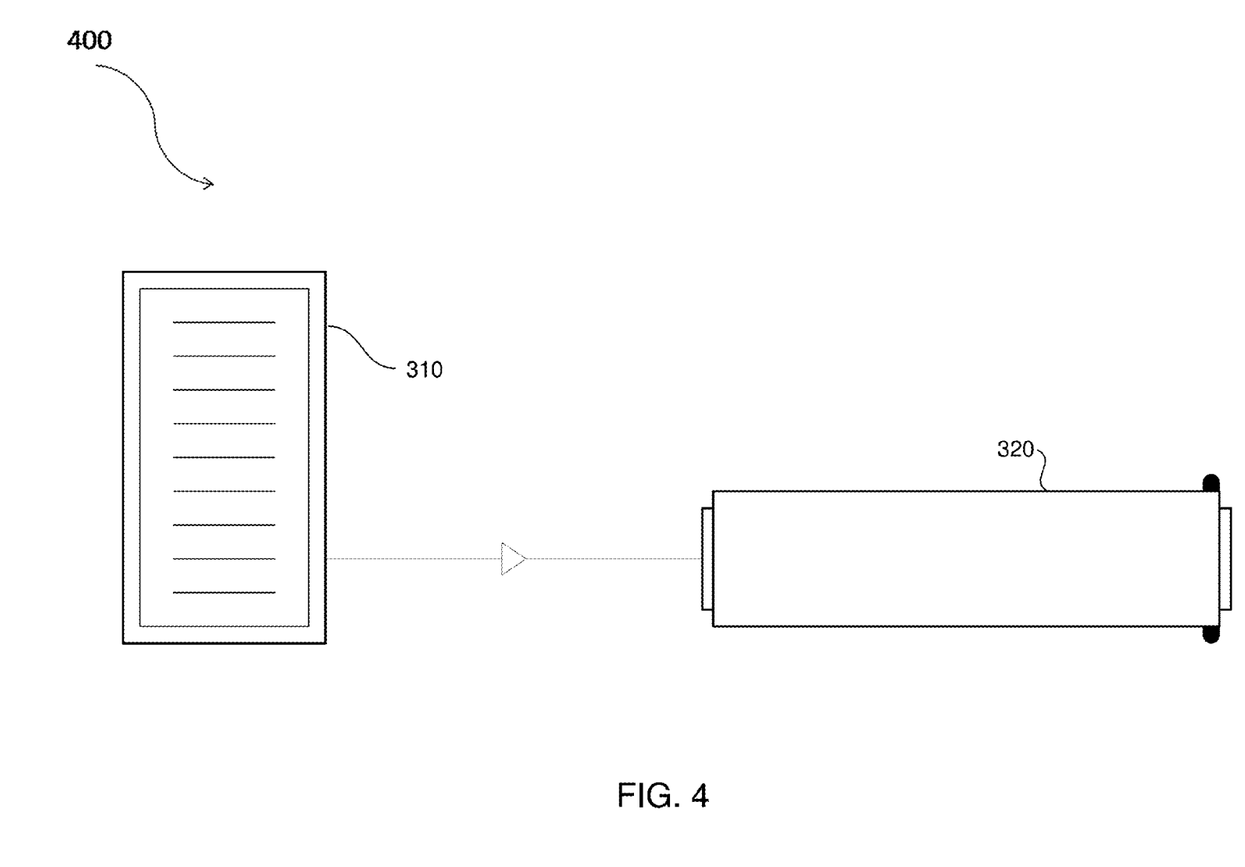
FIG. 4 illustrates system of translating a wafer from a cassette to a destination, in accordance with an embodiment of the present invention.

FIG. 4 illustrates system 400 of translating a wafer from a cassette to a destination, in accordance with an embodiment of the present invention. In particular, FIG. 4 comprises a cassette 310 and a chamber 320. Further, FIG. 4 illustrates transportation of a wafer that is engaged by an apparatus, such as an end effector. For example, a wafer within cassette 310 may be engaged by an apparatus. While removing the wafer from cassette 310, the apparatus may translate the wafer along a plane that is substantially parallel to a plane that is defined by a set of first contact points. As such, the wafer may be removed safely without coming into contact with walls of cassette 310. From cassette 310, the wafer may be transported to a cleaning chamber, such as chamber 320. In alternative embodiments, chamber 320 may have any characteristic that would modify the nature of the wafer so as to necessitate an alternative set of contact points. For instance, if a wafer is cleaned, two sets of contact points would be necessitated: one set of contact points for an unclean wafer and one set of contact points for a clean wafer. Further, if a wafer is treated with a chemical component, two sets of contact points would also be necessitated: one set of contact points for the untreated wafer, and one set of contact points for the treated wafer.

Figure 5:
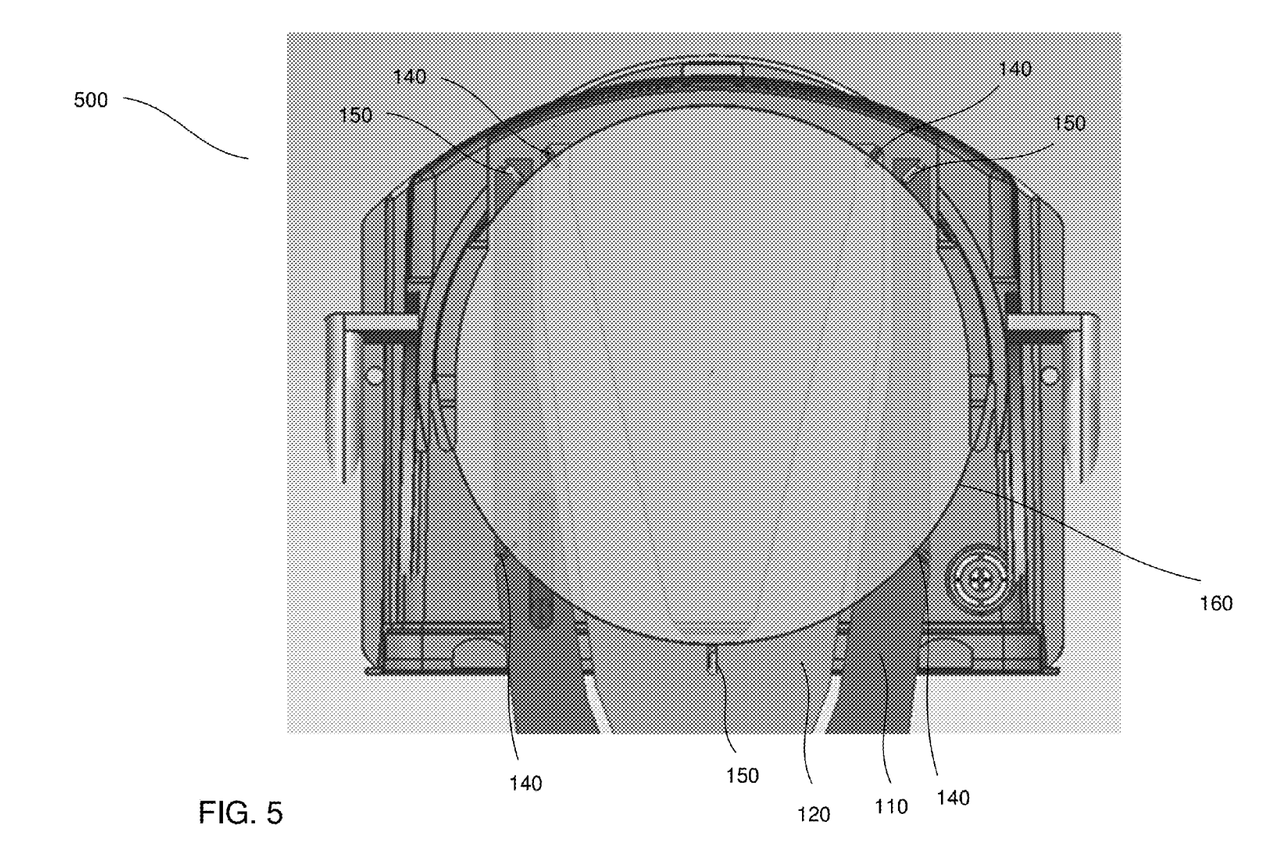
FIG. 5 illustrates an enlarged view of a substrate engaging with a set of first contact points, in accordance with the embodiment of the present invention provided in FIG. 1.

FIG. 5 illustrates an enlarged view 500 of a substrate engaging with a set of first contact points, in accordance with the embodiment of the present invention provided in FIG. 1. In particular, FIG. 5 comprises the apparatus in FIGS. 1 and 2, in the first configuration, having an outer piece 110, an inner piece 120, a set of first contact points 140, a set of second contact points 150, and a wafer 160. As seen in FIG. 5, the substrate is engaged with each contact point of the set of first contact points, but is not engaged with the set of second contact points. In fact, the set of second contact points is completely segregated from the substrate.

Figure 6:
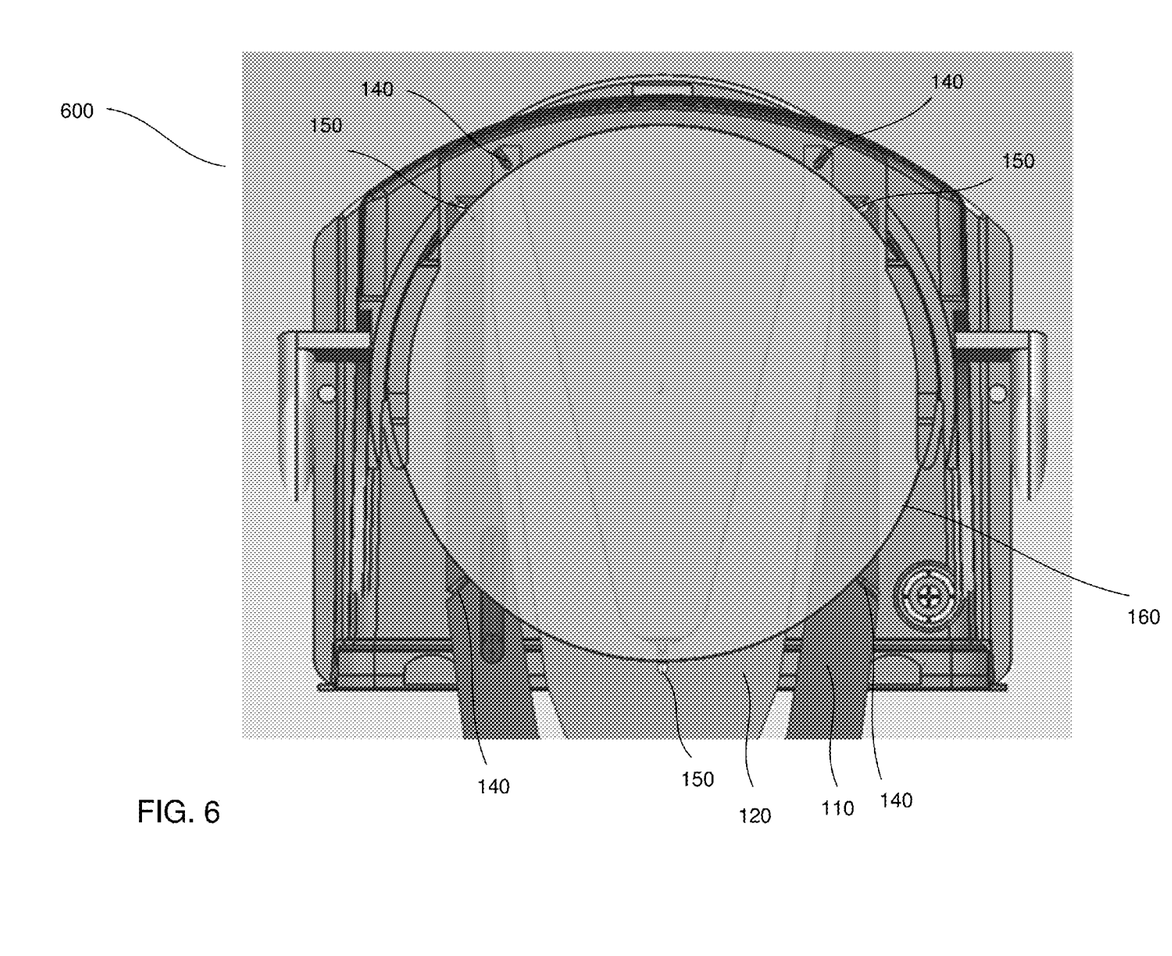
FIG. 6 illustrates an enlarged view of a substrate engaging with a set of second contact points, in accordance with the embodiment of the present invention provided in FIG. 1.

FIG. 6 illustrates an enlarged view 600 of a substrate engaging with a set of second contact points, in accordance with the embodiment of the present invention provided in FIG. 1. In particular, FIG. 6 comprises the apparatus in FIGS. 1 and 2, in the second configuration, having an outer piece 110, an inner piece 120, a set of first contact points 140, a set of second contact points 150, and a wafer 160. As seen in FIG. 6, the substrate is engaged with each contact point of the set of second contact points, but is not engaged with the set of first contact points. In particular, each of the contact points of the set of first contact points is completely separated from the substrate.

Figure 7:
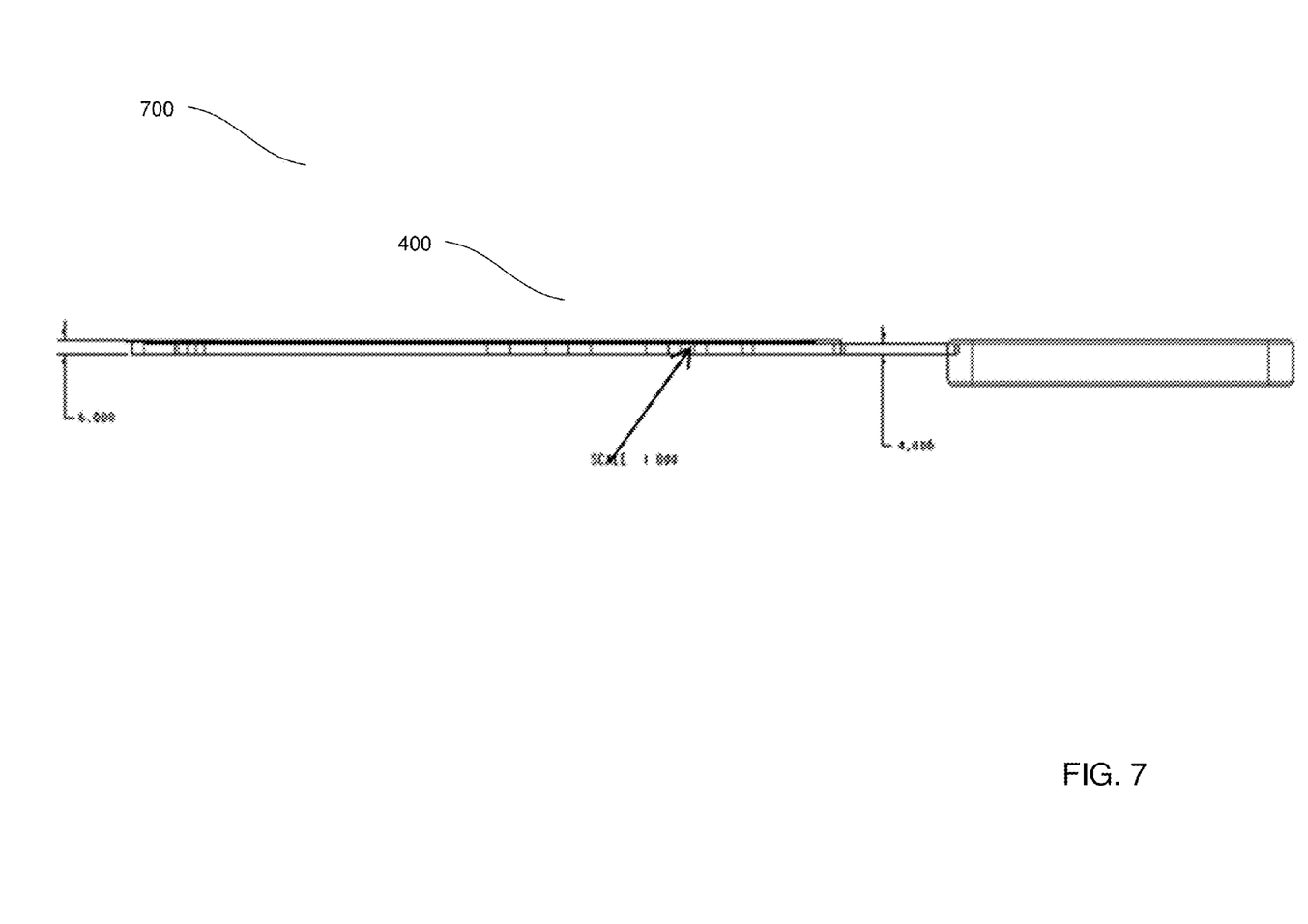
FIG. 7 illustrates a side view of an apparatus, in accordance with the embodiment of the present invention provided in FIG. 1.

FIG. 7 illustrates a side view of an apparatus 400, in accordance with the embodiment of the present invention provided in FIG. 1. FIG. 7 comprises apparatus 400. In particular, FIG. 7 illustrates the shallow height of apparatus 400. This shallow height is a characteristic of apparatus 400 so that apparatus 400 can meet the vertical height requirements of substrate cassettes, such as wafer cassettes.

Embodiments of the present invention may be directed to the processing of 450/300 wafers. Additionally and/or alternatively, embodiments may be directed towards the processing of 300/200 wafers. For example, an apparatus that is associated with 300/200 wafers may be modified in accordance with the present invention. In a further example, however, an apparatus may be modified to accommodate the multi-stage processing of both 450/300 and 300/200 wafers. In particular, the two sets of contact points associated with 450/300 wafers, as discussed above, may be present on an apparatus along with two sets of contact points associated with 300/200 wafers. Further, the two sets of contact points associated with 450/300 wafers may be vertically segregated from the two sets of contact points associated with 300/200 wafers.

Figure 8:
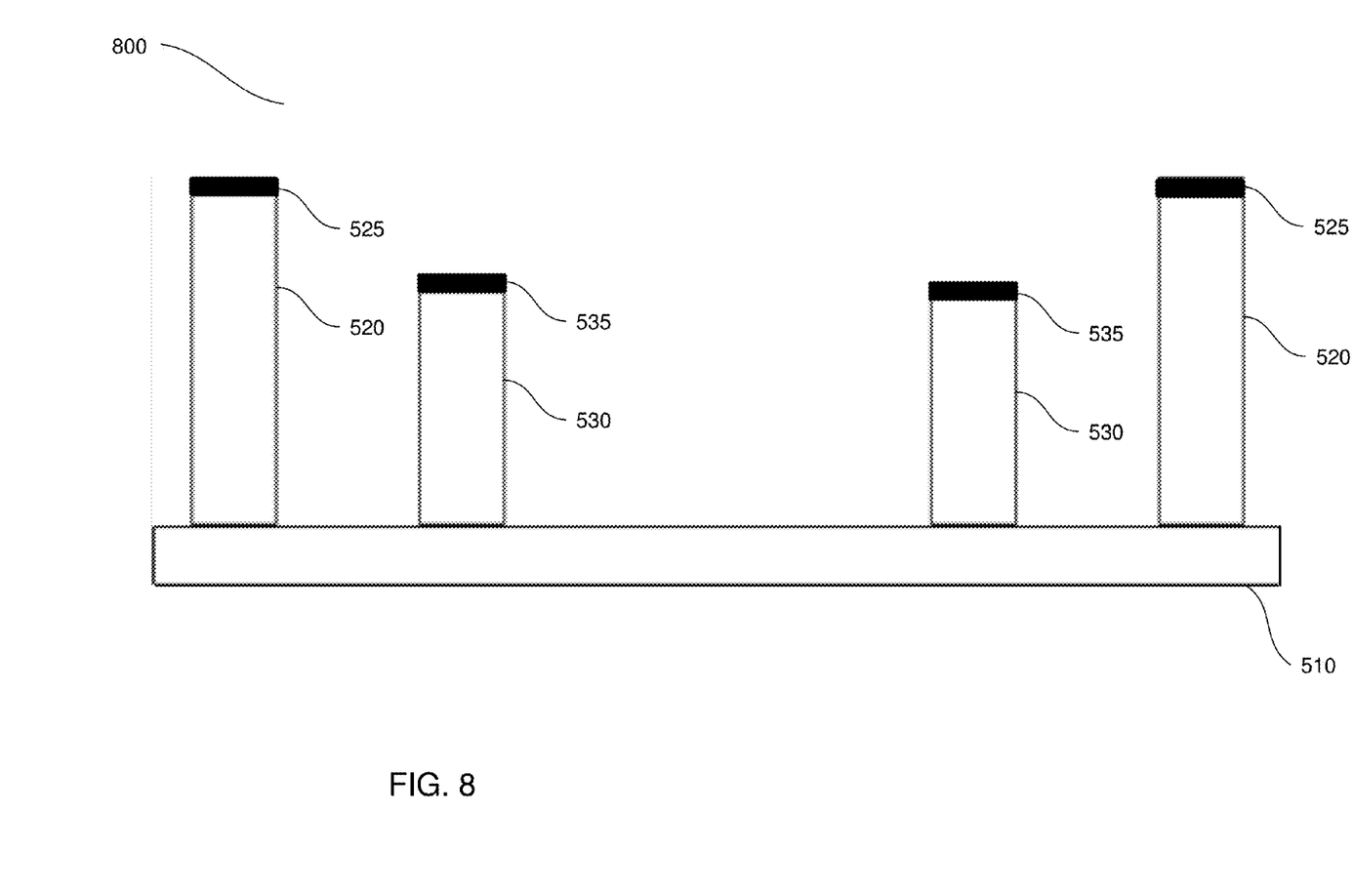
FIG. 8 illustrates vertical displacements between the contact points associated with two sizes of wafers, in accordance with an embodiment of the present invention.

Accordingly, FIG. 8 illustrates vertical displacements between the contact points associated with two sizes of wafers, in accordance with an embodiment of the present invention. FIG. 8 comprises apparatus 800, base platform 510, pads 520 and 530, and contact points 525 and 535. In particular, FIG. 8 illustrates vertical displacement between contact points 525 and contact points 535. Since the contact points are displaced by a vertical distance, for example 2 mm, the 450/300 wafers can sit above the contact points for the 300/200 wafers without being contaminated by the contact points for the 300/200 wafers. The vertical displacement may vary depending on the amount of residue on the contact points of the 300/200 wafers as well as the overall vertical height allowance as controlled by constraints of the wafer cassette itself. For example, if the overall vertical height allowance for a particular wafer cassette is 10 mm, and height of contact points for 300/200 wafers is 5 mm, then the height variance of contact points for 450/300 wafers would be the height of the 300/200 contact points plus a minimum vertical displacement without reaching the maximum vertical height allowance (e.g., 5 mm for the 300/200 height+2 mm as an exemplary height variance=7 mm minimum height for 450/300 contact points).

In a further example, vertical disparity between contact points may be used to nest contact points for a particular wafer size, such as 450/300. In particular, embodiments of the present invention that discuss two sets of contact points having the same height require that each set of contact points are mutually exclusive in their positions to accept a substrate. For example, when the first set of contact points are in a position to accept a substrate, the second set of contact points must be entirely clear of the wafer. However, in alternative embodiments, two sets of contact points having a vertical disparity may require only that one set of contact points be mutually exclusive in its positioning to accept a substrate. For instance, if a set of first contact points is at a height X mm and a set of second contact points is at a height Y mm, where X mm is taller than Y mm, then the set of first contact points may be positioned to accept a substrate even in a configuration where one or more of the second contact points are underneath the substrate. This is due to the fact that so long as the set of first contact points at X mm is taller than the set of second contact points Y mm, a configuration with the set of first contact points in a position to accept a substrate would be in a position to accept the substrate even if one or more contact points of the set of second contact points were underneath, but at a lesser height, than the set of first contact points.

Additionally, embodiments of the present invention may be utilized to transport a wafer from a wafer cassette from a first destination, a second destination, as well as to a third destination. In particular, a separate set of contact points may be associated with each destination. For example, each set of contact points may be positioned to accept a substrate. When each set of contact points are the same height, each set of contact points may be positioned to accept a substrate to the mutual exclusion of each of the other set of contact points. For example, when a set of first contact points is associated with a first destination; a set of second contact points is associated with a second destination; and a set of third contact points is associated with a third destination, the set of first contact points may be positioned to accept a substrate to the mutual exclusion of the set of second contact points and the set of third contact points.

Figure 9:
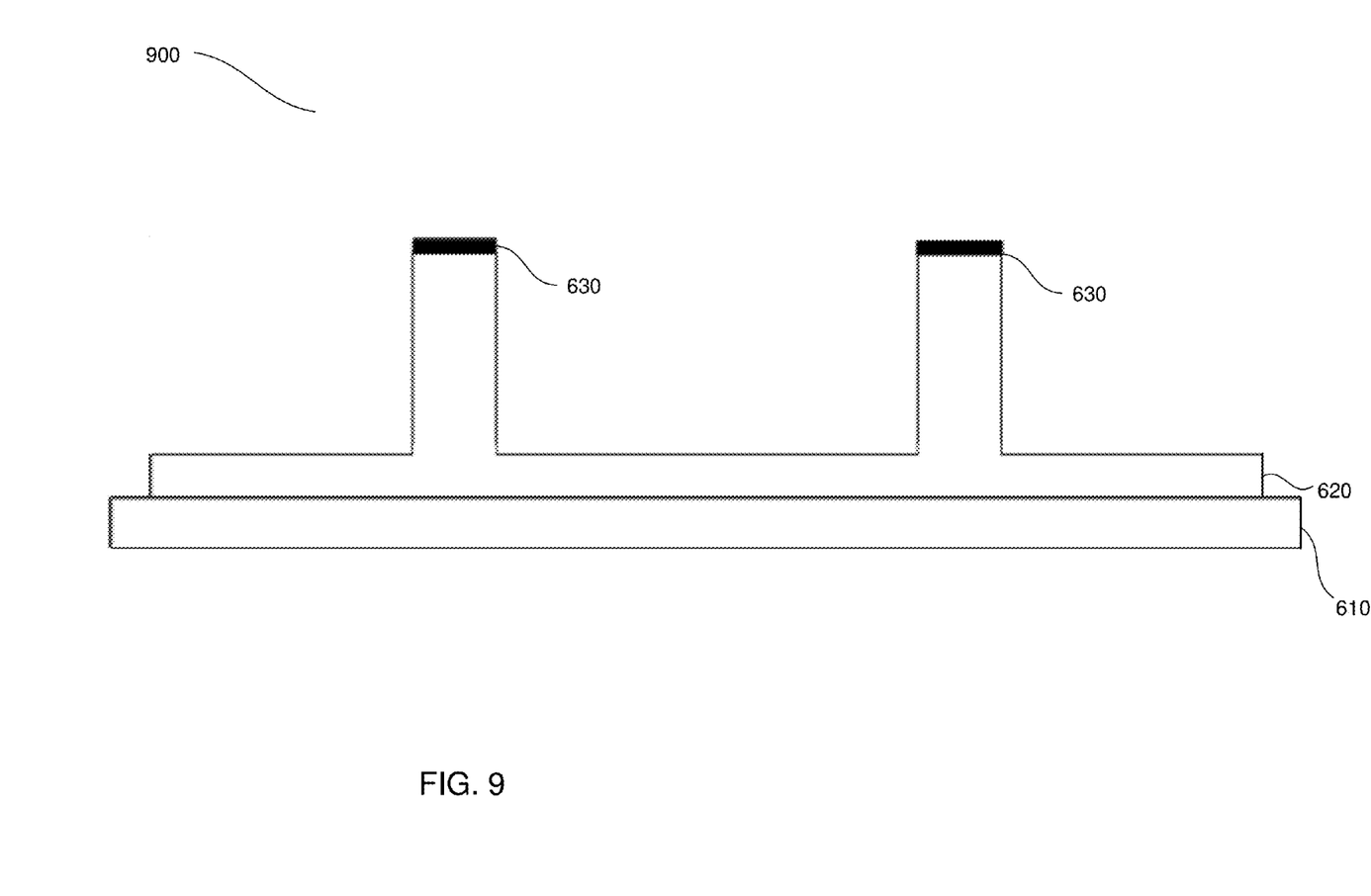
FIG. 9 illustrates a view of two contact points sharing a pad, in accordance with an embodiment of the present invention.

FIG. 9 illustrates a view 900 of two contact points sharing a pad, in accordance with an embodiment of the present invention. In particular, FIG. 9 comprises base platform 610, pad 620, and contact points 630. Embodiments of the present invention include configurations where two or more contact points share the same pad. As seen in FIG. 9, contact points 630 are both part of pad 620. In further embodiments, contact points sharing the same pad may also have different heights, shapes, or slopes. For instance, a first contact point be a sloped portion of a pad while a second contact point may be a flat-topped portion of the same pad.

Figure 10:
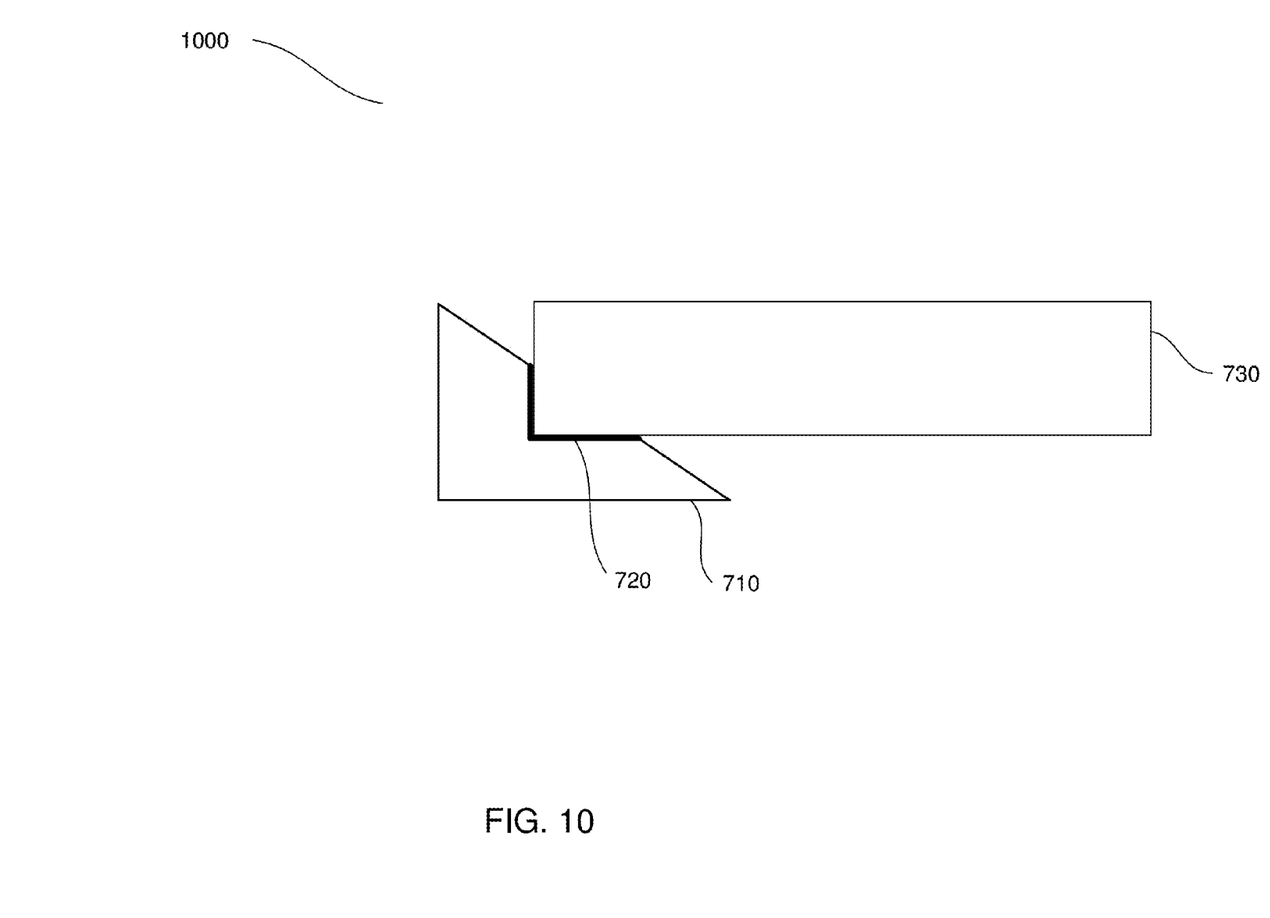
FIG. 10 illustrates a view of a substrate engaging with a contact point of a sloped pad, in accordance with an embodiment of the present invention.

FIG. 10 illustrates a view 1000 of a substrate engaging with a contact point of a sloped pad, in accordance with an embodiment of the present invention. In particular, FIG. 10 comprises pad 710, contact point 720, and substrate 730. Embodiments of the present invention may have a substrate engage with flat-topped contact points, as seen in FIG. 3. Additionally or alternatively, embodiments of the present invention may have a substrate engage with a sloped pad, such as pad 710. Accordingly, a contact point of a sloped pad may comprise a flat portion of the sloped pad. Alternatively, a contact point of a sloped pad may comprise a notch of the sloped pad, as seen in FIG. 10. In particular, FIG. 10 illustrates a sloped pad 710 having a notch that serves as the contact point 720 that engages with substrate 730.

Figure 11:
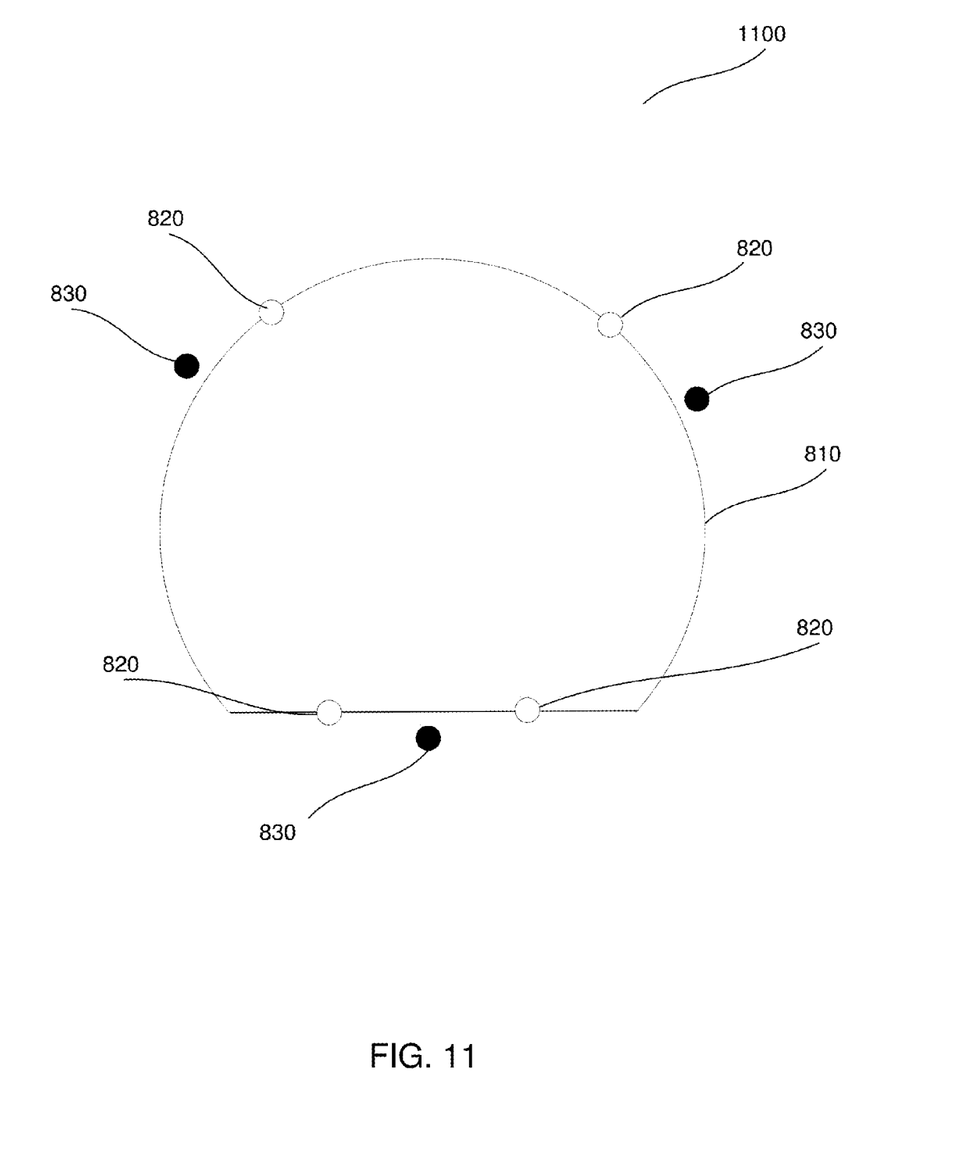
FIG. 11 illustrates a view of an alternative shape of a substrate engaging at contact points, in accordance with an embodiment of the present invention.

FIG. 11 illustrates a view 1100 of an alternative shape of a substrate engaging with contact points, in accordance with an embodiment of the present invention. In particular, FIG. 11 comprises substrate 810, a set of first contact points 820, and a set of second contact points 830. FIG. 11 is provided as an example of an alternative shaper of a substrate, but is not drawn to scale. Further, as seen in FIG. 11, substrate 810 may engage with a set of first contact points 820 to the exclusion of a set of second contact points 830. Further, even though substrate 810 is illustrated as a circle with a portion cut off, the substrate diameter of substrate 810 would be assessed as the diameter of the overall substrate 810. Accordingly, in this example, the overall substrate diameter would be equal to the diameter of a similar circle without a portion cut off.

In a specific example, a first position of an inner piece relative to an outer piece of an apparatus may arrange that all of the contact points of the set of first contact points are included in an area that is defined by the substrate. In particular, points are included in an area when the points are on the border of the area or within the area. Additionally, the first position also arranges that all of the contact points of the set of second contact points are outside the area that is defined by the substrate.

In a further example, the second position of an inner piece relative to an outer piece of an apparatus may arrange that all of the contact points of the set of second contact points are included in the area that is defined by the substrate. Additionally, the second position also arranges that all of the contact points of the set of first contact points are outside the area that is defined by the substrate.

Figure 12:
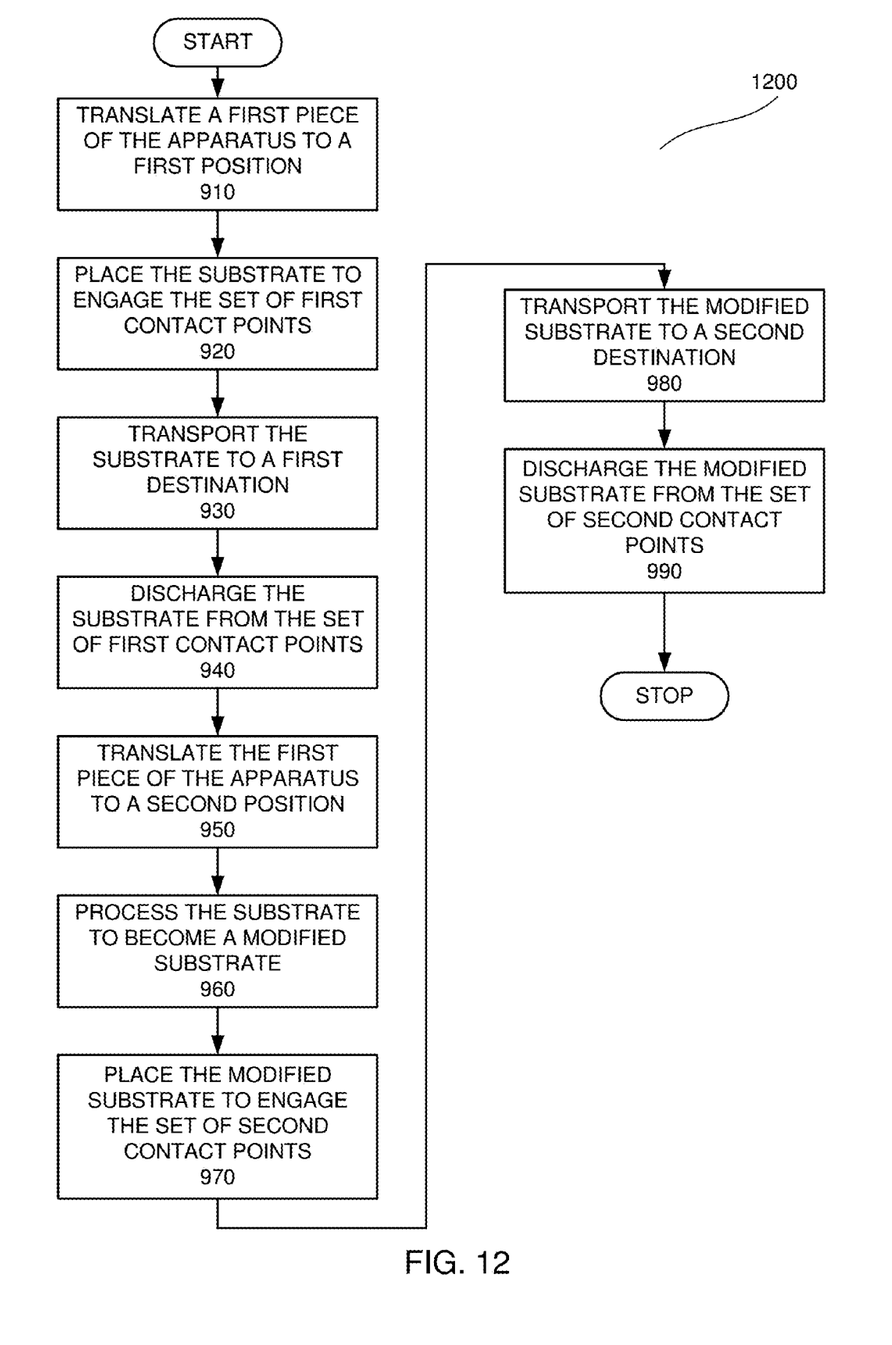
FIG. 12 is flow chart of a method of using an apparatus to transport a substrate, in accordance with an embodiment of the present invention.

FIG. 12 illustrates a flow chart 1200 of a method of using an apparatus to transport a substrate. In particular, at 910, a first piece of the apparatus is translated to a first position. In particular, the first position may arrange a set of first contact points so that all of the contact points of the set of first contact points are able to engage the substrate. Additionally, the first position may arrange a set of second contact points so that none of the contact points of the set of second contact points are able to engage the substrate. As such, the set of second contact points do not engage the substrate when the apparatus is in the first position. Further, the first piece of the apparatus is translated to the first position along a plane that is defined as including each of the set of first contact points.

In a specific example, the first position may arrange that all of the contact points of the set of first contact points are circumscribed within a circle having a diameter that is equal to the substrate diameter. A set of points is circumscribed within a circle when the points are on or within the circle. Further, the first position may also arrange that all of the contact points of the set of second contact points are outside a circle having a diameter that is equal to the substrate diameter.

Additionally, at 920, the substrate is placed to engage the set of first contact points. Further, at 930, the engaged substrate is transported to a first destination. In particular, the engaged substrate may be transported substantially parallel to a plane that is defined by the set of first contact points. Additionally, the substrate may be transported from a substrate chamber, such as a wafer chamber, to a robotic arm. The robotic arm may then place the substrate in a cleaning chamber. Alternatively, the substrate may be transported directly from a substrate chamber to a cleaning chamber. At 940, the substrate is discharged from the set of first contact points.

Further, at 950, a first piece of the apparatus is translated to a second position. In particular, the second position may arrange a set of first contact points so that none of the contact points of the set of first contact points are able to engage the substrate. Additionally, the second position may arrange a set of second contact points so that all of the contact points of the set of second contact points are able to engage the substrate. As such, the set of first contact points do not engage the substrate when the apparatus is in the second position.

In a specific example, the second position may arrange that all of the contact points of the set of second contact points are circumscribed within a circle having a diameter that is equal to the substrate diameter. Further, the second position may also arrange that all of the contact points of the set of first contact points are outside a circle having a diameter that is equal to the substrate diameter Additionally, at 960, the substrate is processed to become a modified substrate. In particular, the substrate may be cleaned, etched, treated with a chemical, or modified in another way. Further, at 970, the modified substrate is placed to engage the set of second contact points. Further, at 980, the engaged substrate is transported to a second destination. In particular, the engaged substrate may be transported substantially parallel to a plane that is defined by the set of first contact points. For example, the modified substrate may be transported from a robotic arm to a substrate cassette, such as a wafer cassette. The robotic arm may have retrieved the modified substrate from the cleaning chamber. Alternatively, the modified substrate may be transported directly from a cleaning chamber to a substrate cassette. At 990, the modified substrate is discharged from the set of second contact points.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for lifting a substrate, the apparatus comprising:
   a first piece;
   a second piece;
   a set of first contact points in a first plane, wherein at least one first contact point is on the first piece and at least one first contact point is on the second piece;
   a set of second contact points, wherein at least one second contact point is on the first piece and at least one second contact point is on the second piece; and
   an actuator that translates the first piece, substantially parallel to the first plane, between a first position and a second position relative to the second piece,
      the first position arranging the set of first contact points so that all of the contact points of the set of first contact points are able to engage the substrate, and further arranging the set of second contact points so that none of the contact points of the set of second contact points are able to engage the substrate, and wherein the first position also arranges that all of the contact points of the set of first contact points are included in an area that is defined by the substrate, and further wherein the first position also arranges that all of the contact points of the set of second contact points are outside the area that is defined by the substrate, and
      the second position arranging the set of second contact points so that all of the contact points of the set of second contact points are able to engage the substrate, and further arranging the set of first contact points so that none of the contact points of the set of first contact points are able to engage the substrate, and wherein the second position also arranges that all of the contact points of the set of second contact points are included in the area that is defined by the substrate, and further wherein the second position also arranges that all of the contact points of the set of first contact points are outside the area that is defined by the substrate, wherein at least one first contact point or at least one second contact point is a flat area of a pad on which the substrate is configured to rest.

2. The apparatus of claim 1, wherein each contact point of the set of second contact points is in the first plane.

3. The apparatus of claim 1, wherein the substrate is a wafer.

4. The apparatus of claim 1, wherein at least two contact points selected from the set of first contact points or set of second contact points are two flat regions of a shared pad on which the substrate is configured to rest.

5. The apparatus of claim 4, wherein at least one contact point of the set of first contact points shares the pad with at least one contact point of the set of second contact points.

6. The apparatus of claim 1, wherein the first piece and the second piece are fork shaped.

7. A method of using an apparatus to transport a substrate, the method comprising:

translating a first piece of the apparatus along a first plane with respect to a second piece of the apparatus to a first position, the first position arranging a set of first contact points so that all of the contact points of the set of first contact points are able to engage the substrate, and the first position further arranging a set of second contact points so that none of the contact points of the set of second contact points are able to engage the substrate, wherein the first position also arranges that all of the contact points of the set of first contact points are included in an area that is defined by the substrate, and further wherein the first position also arranges that all of the contact points of the set of second contact points are outside the area that is defined by the substrate, wherein the first plane is defined as including each of the set of first contact points wherein at least one first contact point or at least one second contact point is a flat area of a pad on which the substrate is configured to rest;

placing the substrate to engage the set of first contact points;

transporting the substrate, substantially parallel to the first plane, to a first destination;

discharging the substrate from the set of first contact points;

translating the first piece of the apparatus substantially parallel to the first plane with respect to the second piece of the apparatus to a second position, the second position arranging the set of second contact points so that all of the contact points of the set of second contact points are able to engage the substrate, and the second position further arranging the set of first contact points so that none of the contact points of the set of first contact points are able to engage the substrate, wherein the second position also arranges that all of the contact points of the set of second contact points are included in the area that is defined by the substrate, and further wherein the second position also arranges that all of the contact points of the set of first contact points are outside the area that is defined by the substrate;

processing the substrate to become a modified substrate;

placing the modified substrate to engage the set of second contact points;

transporting the modified substrate, substantially parallel to the first plane, to a second destination; and discharging the modified substrate from the set of second contact points.

8. The method of claim 7, wherein each contact point of the set of second contact points is in the first plane.

9. The method of claim 7, wherein at least two contact points selected from the set of first contact points or set of second contact points are two flat regions of a shared pad on which the substrate is configured to rest.

10. The method of claim 9, wherein at least one contact point of the set of first contact points shares the pad with at least one contact point of the set of second contact points.

11. The method of claim 7, wherein the first piece and the second piece are fork shaped.

* * * * *